US006969688B2

(12) United States Patent
Perng et al.

(10) Patent No.: US 6,969,688 B2

(45) Date of Patent: Nov. 29, 2005

(54) WET ETCHANT COMPOSITION AND METHOD FOR ETCHING HFO2 AND ZRO2

(75) Inventors: Baw-Ching Perng, Hsin-Chu (TW); Fang-Cheng Chen, Hsin-Chu (TW); Hun-Jan Tao, Hsinchu (TW); Peng-Fu Hsu, Hsin-Chu (TW); Yue-Ho Hsieh, Hsinchu (TW); Chih-Cheng Wang, Hsinchu (TW); Shih-Yi Hsiao, Chiai (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 222 days.

(21) Appl. No.: 10/266,880

(22) Filed: Oct. 8, 2002

(65) Prior Publication Data

US 2004/0067657 A1 Apr. 8, 2004

(51) Int. Cl.[7] .......... H01L 21/302

(52) U.S. Cl. .......... 438/745; 438/747; 438/748; 438/754; 438/756

(58) Field of Search .......... 438/745, 747, 438/748, 754, 756

(56) References Cited

U.S. PATENT DOCUMENTS

| | | | | |
|---|---|---|---|---|
| 6,476,454 | B2 * | 11/2002 | Suguro | 257/410 |
| 6,586,293 | B1 * | 7/2003 | Hasegawa | 438/216 |
| 6,743,529 | B2 * | 6/2004 | Saito et al. | 428/694 SG |
| 6,790,782 | B1 * | 9/2004 | Yang et al. | 438/706 |

* cited by examiner

*Primary Examiner*—Nadine G. Norton
*Assistant Examiner*—Binh X. Tran
(74) *Attorney, Agent, or Firm*—Tung & Associates

(57) ABSTRACT

A wet etchant solution composition and method for etching oxides of hafnium and zirconium including at least one solvent present at greater than about 50 weight percent with respect to an arbitrary volume of the wet etchant solution; at least one chelating agent present at about 0.1 weight percent to about 10 weight percent with respect to an arbitrary volume of the wet etchant solution; and, at least one halogen containing acid present from about 0.0001 weight percent to about 10 weight percent with respect to an arbitrary volume of the wet etchant solution.

11 Claims, 1 Drawing Sheet

WET ETCHANT COMPOSITION AND METHOD FOR ETCHING HFO2 AND ZRO2

FIELD OF THE INVENTION

The present invention relates generally to CMOS device fabrication processes and, more particularly, to a wet etchant composition and method for etching oxides of hafnium and zirconium.

BACKGROUND OF THE INVENTION

Fabrication of a metal-oxide-semiconductor (MOS) integrated circuit involves numerous processing steps. A gate dielectric, typically formed from silicon dioxide, is formed on a semiconductor substrate which is doped with either n-type or p-type impurities. For each MOS field effect transistor (MOSFET) being formed, a gate electrode is formed over the gate dielectric, and dopant impurities are introduced into the substrate to form source and drain regions. A pervasive trend in modern integrated circuit manufacture is to produce transistors having feature sizes as small as possible. Many modern day semiconductor microelectronic fabrication processes form features having less than 0.25 critical dimensions, for example in future processes even less than 0.13 microns. As feature size decreases, the size of the resulting transistor as well as transistor features also decrease. Fabrication of smaller transistors allows more transistors to be placed on a single monolithic substrate, thereby allowing relatively large circuit systems to be incorporated on a single die area.

In semiconductor microelectronic device fabrication, polysilicon and silicon dioxide ($SiO_2$) are commonly used to respectively form gate electrodes and gate dielectrics for metal-oxide-semiconductor (MOS) transistors. As device dimensions have continued to scale down, the thickness of the $SiO_2$ gate dielectric layer has also decreased to maintain the same capacitance between the gate and channel regions. A thickness of the gate oxide layer of less than 2 nanometers (nm) will be required to meet smaller device design constraints. A problem with using $SiO_2$ as the gate dielectric is that thin $SiO_2$ oxide films may break down when subjected to electric fields expected in some operating environments, particularly for gate oxides less than about 50 Angstroms thick. In addition, electrons more readily pass through an insulating gate dielectric as it gets thinner due to what is frequently referred to as the quantum mechanical tunneling effect. In this manner, a tunneling current, produces a leakage current passing through the gate dielectric between the semiconductor substrate and the gate electrode, increasingly adversely affecting the operability of the device.

Because of high direct tunneling currents, $SiO_2$ films thinner than 1.5 nm cannot be used as the gate dielectric in CMOS devices. There are currently intense efforts to replace $SiO_2$ with high-k (high dielectric constant) dielectrics, including for example, $TiO_2$, $Ta_2O_5$, $ZrO_2$, $Y_2O_3$, $La_2O_5$, $HfO_2$, and their aluminates and silicates attracting the greatest attention. A higher dielectric constant gate dielectric allows a thicker gate dielectric to be formed which dramatically reduces tunneling current and consequently gate leakage current, thereby overcoming a severe limitation in the use of $SiO_2$ as the gate dielectric. While silicon dioxide ($SiO_2$) has a dielectric constant of approximately 4, other candidate high-k dielectrics have significantly higher dielectric constant values of, for example, 20 or more. Using a high-k material for a gate dielectric allows a high capacitance to be achieved even with a relatively thick dielectric. Typical candidate high-k dielectric gate oxide materials have high dielectric constant in the range of about 20 to 40.

There have been, however, difficulties in removing or etching certain high-k dielectric materials, particularly, oxides of hafnium and zirconium, for example hafnium dioxide and zirconium dioxide. Chemical etchants used with high-k materials may cause damage to associated oxide materials making high temperature rapid thermal oxidation (RTO) processes necessary to repair such damage which in turn may adversely affect the crystallinity or level of defects at the gate dielectric/silicon or silicon dioxide interface thereby degrading electrical performance. For example, typically a shallow trench isolation (STI) electrical isolation structure is formed adjacent a CMOS structure to electrically isolate the various CMOS devices. A high-k dielectric layer is formed over the silicon substrate including the STI trench which has been previous backfilled with $SiO_2$. In a subsequent etching step to remove a portion of the high-k gate dielectric surrounding the gate structure to reveal the silicon substrate, for example to form a metal silicide layer, a high selectivity of etching of the high-k gate dielectric to $SiO_2$ is required to avoid etching the STI oxide which tends to form etching divots at the STI trench corner regions thereby degrading electrical isolation performance. In addition, high-k dielectrics such as oxides of zirconium and hafnium are increasingly advantageously used as etching stop layers due to their etching resistance. Prior art processes for removing oxides of hafnium and zirconium have use sulfuric acid heated to temperatures of between about 150° C. and about 180° C. The selectivity in the etching rate of the oxides of hafnium and zirconium, for example hafnium dioxide ($HfO_2$) and zirconium dioxide ($ZrO_2$), with respect to $SiO_2$, is about 0.6 to about 1 with an etching rate of about 1 Angstrom/min. As a result, etching rates and selectivity to underlying $SiO_2$ layers for etching of oxides of hafnium and zirconium is not optimal, successful etching operations optimally requiring higher etching rates and selectivity with respect to $SiO_2$ thereby allowing reduced processing times and larger processing windows without the formation of etching divots. In addition, the added cost of implementing adequate environmental and safety protective measures for handling hot sulfuric acid as well as providing acid resistant processing tools is undesirable.

For example referring to FIG. 1A is shown a cross sectional view of a portion of a CMOS semiconductor device showing a STI trench 12A formed in silicon substrate 10 and backfilled with STI oxide 12B. Overlying the STI oxide is a high-k dielectric material layer 14, for example hafnium dioxide or zirconium dioxide, formed for forming a gate dielectric in a CMOS device in an adjacent gate structure (not shown). Referring to FIG. 1B according to prior art methods of etching the high-k dielectric material layer, using, for example hot sulfuric acid, etching divots e.g., 16A and 16B are formed at the STI trench corner regions degrading device electrical isolation.

Therefore it would be advantageous to the semiconductor micro-fabrication processing art to develop a lower cost and more effective wet etching composition and method for etching high-k materials including oxides of hafnium and zirconium.

It is therefore an object of the invention to provide a lower cost and more effective wet etching composition and method for etching high-k materials including oxides of hafnium and zirconium while overcoming other shortcomings and deficiencies of the prior art.

SUMMARY OF THE INVENTION

To achieve the foregoing and other objects, and in accordance with the purposes of the present invention, as embodied and broadly described herein, the present invention provides a wet etchant solution composition and method for etching oxides of hafnium and zirconium.

In a first embodiment, the composition includes at least one solvent present at greater than about 50 weight percent with respect to an arbitrary volume of the wet etchant solution; at least one chelating agent present at about 0.1 weight percent to about 10 weight percent with respect to an arbitrary volume of the wet etchant solution; and, at least one halogen containing acid present from about 0.0001 weight percent to about 10 weight percent with respect to an arbitrary volume of the wet etchant solution.

In related embodiments, the wet etchant solution further includes at least one surfactant present at about 0.1 weight percent to about 10 weight percent with respect to an arbitrary volume of the wet etchant solution.

In other related embodiments, the at least one solvent includes at least one of $H_2O$, $HClO_4$, an alcohol, tetrahydrofuran (THF), sulfuric acid ($H_2SO_4$) and dimethyl sulfoxide (DMSO). Further, the at least one chelating agent is selected from the group consisting of diamines and beta-diketones. Further yet, the at least one surfactant is selected from the group consisting of polyols. Yet further, the at least one halogen containing acid includes at least one of HF, HBr, HI, and $H_3ClO_4$.

In another aspect of the invention a method is provided for wet etching oxides of hafnium and zirconium in a semiconductor micro-fabrication process including providing a material layer comprising an oxide of one of at least one of hafnium and zirconium overlying a silicon dioxide containing material layer; and, wet etching the material layer with a wet etching solution comprising at least a solvent and a halogen containing acid formed to have a first etching rate with respect to the material layer that is at least about a factor of 2.5 greater than a second etching rate with respect to the silicon dioxide.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
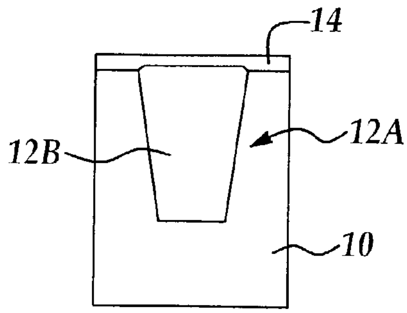
FIGS. 1A and 1B are a cross sectional side views of an exemplary STI structure formed according to prior art wet etching processes.
Figure 1B:
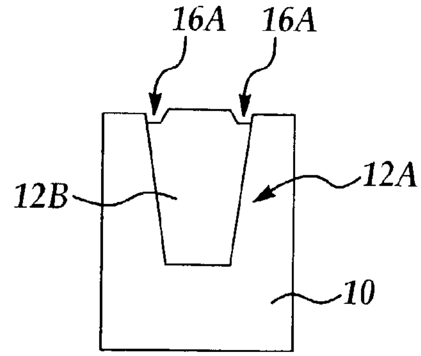

Although the method and composition of the present invention is explained with reference to the wet etching of oxides of hafnium and zirconium, it will be appreciated that the wet etching composition of the present invention may be used for the wet etching of any material where wet etching may advantageously be performed in semiconductor micro-fabrication process having a comparable etching rate and a selectivity to $SiO_2$. In addition, although the method of the present invention is explained with reference to forming a gate structure, it will be appreciated that the wet etchant composition of the present invention may be used in any semiconductor feature manufacturing process to selectively remove layers of material, for example an etch stop layer, preferably including oxides of hafnium and zirconium, overlying an $SiO_2$ containing material layer. The term "substrate" is defined to mean any semiconductive substrate material including conventional semiconductor wafers.

In a first embodiment according to the present invention a wet etching composition for etching oxides of hafnium and zirconium, preferably at least one of hafnium dioxide and zirconium dioxide is provided. In a first embodiment, the wet etching composition comprises greater than about 50 wt % of one or more solvents, about 0 wt % to about 10 wt % of one or more chelating agents, 0 wt % to about 10 wt % of one or more surfactants and about 0.0001 wt. % to about 10 wt. % of one or more halogen containing acids. It will be appreciated that the etching rate of oxides of hafnium and zirconium will depend in part on the manner of formation of the oxides and in part on the wet etchant composition including the type of halogen containing acids, chelating agents, and solvents. For example, the polarity of the solvents may affect the rate of molecular diffusion and the subsequent interaction of the chelating agent or the acid with the etching target surface. In addition, it will be appreciated that surfactants in some cases will aide the etching action by facilitating the interaction of the acid and chelating agents with the targeted etching surface.

The solvents are preferably but not limited to at least one of $H_2O$, $HClO_4$, alcohol, including methyl, primary, secondary, tertiary, allyl and benzyl alcohols, tetrahydrofuran (THF), Dimethyl sulfoxide (DMSO), sulfuric acid ($H_2SO_4$), and dimethyl sulfoxide (DMSO).

The chelating agents, if used, are preferably but not limited to at least one of diamines, beta-diketones, and ethylene-diamine-tetra-acetic acid (EDTA). Other chelating agents that may suitably be used include ammonium salts including ammonium tartrate, ammonium citrate, ammonium formate; ammonium glucomate; inorganic ammonium salts, such as ammonium fluoride, ammonium nitrate, ammonium thiosulfate, ammonium persulfate, ammonium bicarbonate, ammonium phosphate, and the like. Exemplary diamines include ethylene diamine, and 2-methylene-amino-propylene-diamine. Other complexing agents may be used as chelating agents to chelate oxides of hafnium and zirconium include tri- and polycarboxylic acids and salts with secondary or tertiary hydroxyl groups in an alpha position relative to a carboxyl group such as citric acid and citrates.

The surfactants, if used are preferably but not limited to at least one polyols. Polyols are defined as structures with two OH groups on adjacent carbons, for example including glycol and glycerol otherwise referred to as 1,2 propanediol and 1,2,3 propanetriol respectively. The halogen containing acids are preferably hydrogen fluoride (HF), hydrogen bromide (HBr), hydrogen iodide (HI), and $H_3ClO_4$. For example an exemplary wet etching composition includes about 10 wt % HF and about 90 wt % ethanol. Another exemplary wet etching composition includes 10 wt % HF, 3 wt % glycol, 3 wt % EDTA, and about 84 wt % ethanol.

Figure 2A:
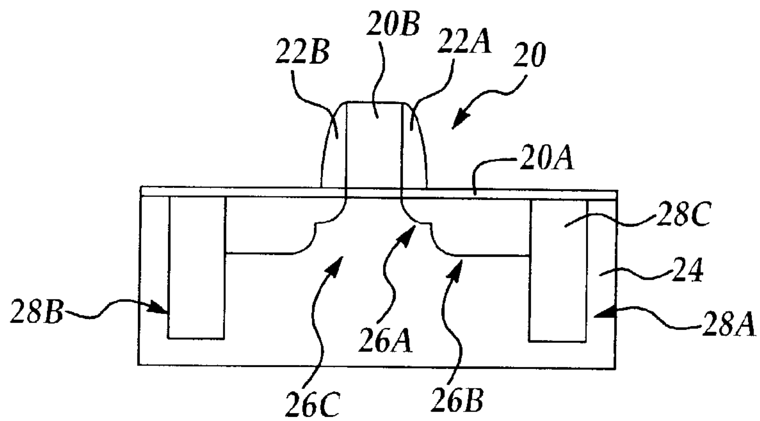
FIGS. 2A and 2B are a cross sectional side views of an exemplary CMOS device formed according to an exemplary implementation of an embodiment of the wet etchant and wet etching method of the present invention.

In an exemplary implementation of the wet etching composition of the present invention, referring to FIG. 2A is shown a cross sectional side view of a portion of an exemplary CMOS transistor having a gate structure 20 including a high-k gate dielectric layer 20A, preferably including at least one of hafnium dioxide ($HfO_2$) and zirconium dioxide ($ZrO_2$) about 30 Angstroms to about 60 Angstroms in thickness, overlying an optionally formed silicon dioxide ($SiO_2$) layer (not shown) about 5 Angstroms to about 15 Angstroms in thickness. The gate dielectric 20A is formed overlying a semiconductor substrate 24, for example a silicon substrate including lightly doped regions e.g., 26A, and more heavily doped source/drain regions, e.g., 26B. Shallow trench isolation (STI) regions, e.g., 28A and 28B surround the active area or channel region 26C of the doped silicon substrate 24 to electrically isolate the gate structure channel region from adjacent devices (not shown). The STI trenches are formed by conventional methods known in the art including being backfilled with $SiO_2$, 28C also referred to as an STI oxide. The regions 26A and 26B are typically formed following the formation of the gate structure by ion implantation and annealing processes known in the art.

Still referring to FIG. 2A, an electrically conductive gate electrode 20B, for example polysilicon, is formed over the gate dielectric layer 20A. The gate structure is formed by conventional deposition of polysilicon followed by a photolithographic and etching processes. Typically a first ion implantation process is then carried out to form the LDD regions e.g., 26A and optionally dope the polysilicon electrode for improved electrical conductivity. An oxide or nitride is then deposited over the gate structure 20 followed by conventional photolithographic and etching processes to form sidewall spacers e.g., 22A and 22B on either side of the gate structure. The sidewall spacers are typically formed including for example at least one of silicon oxide (e.g., $SiO_2$), silicon oxynitride (e.g., SiON), and silicon nitride (e.g., SiN) including multiple layered spacers by methods known in the art including conventional deposition and etchback processes. A second ion implantation process is then carried out to form the more heavily doped source/drain regions e.g., 26B in a self aligned ion implantation process where the sidewall spacers e.g., 22A act as an implantation mask to form N type or P type doping regions depending on whether a PMOS or NMOS type device is desired.

Figure 2B:
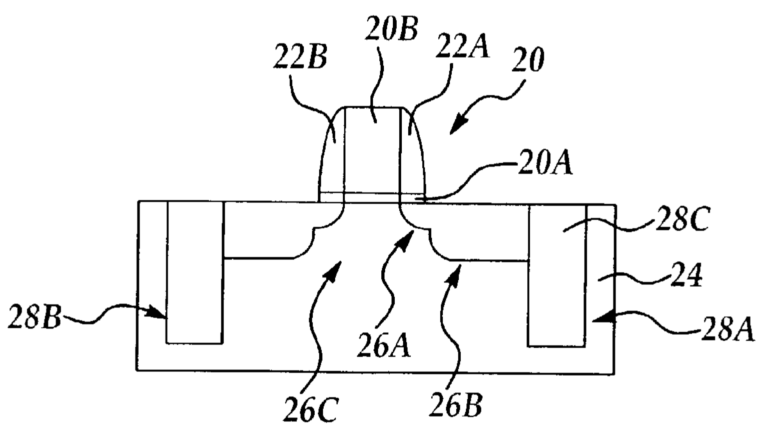

Referring to FIG. 2B, following the gate structure formation including ion implantation and annealing processes to form the doped regions in the silicon substrate, a wet etching process using the wet etching composition according to preferred embodiments of the present invention is then used in a conventional wet etching process to remove selected portions of the gate dielectric layer 20A surrounding the gate structure 20. For example, the wet etching process preferably includes at least one of an immersion process or a spraying process. For example, in an immersion or dipping process the semiconductor process wafer is dipped into a wet etching solution for a period of time to substantially remove the gate dielectric layer on either side of the gate structure to expose the silicon substrate. Preferably, the gate dielectric layer includes at least one of hafnium dioxide and zirconium dioxide. If a thin $SiO_2$ layer is present underlying the gate dielectric layer and overlying the silicon substrate, a second wet etching process may be used to remove the $SiO_2$ layer to reveal the silicon substrate. It will be appreciated that substantially complete removal of the gate dielectric layer 20A at selected portions of the process surface either side of the gate structure 20 including any underlying oxide over the silicon substrate is required in order to successfully form a subsequent silicide or self-aligned silicide (salicide) contacts, for example a cobalt silicide ($CoSi_2$) or titanium silicide ($TiSi_2$), over the doped portions e.g., 26B of the silicon substrate adjacent the gate structure and the upper portion of the polysilicon gate electrode 20B.

In an exemplary application using the wet etchant solution composition according to preferred embodiments of the present invention the wet etchant solution is preferably maintained at a temperature of from about 23° C. to about 60° C. Preferably the wet etchant solution is formulated to have an etching rate of the gate dielectric layer with respect to the silicon dioxide of about 2.5 or greater. Preferably the etching rate of the gate dielectric layer is greater than about 5 Angstroms per minute.

According to the wet etching composition of the present invention it has been found that a gate dielectric layer including $HfO_2$ or $ZrO_2$ can be advantageously etched with a high selectivity to $SiO_2$ for example, greater than about 2.5 with respect to a an $SiO_2$ etching rate. As such, etching divots into the edge portions of the STI trench oxide 28C are advantageously avoided thereby improving electrical isolation performance and reliability.

It will be appreciated that the wet etching composition of the present invention may advantageously be used in a variety of semiconductor micro-fabrication processes, for example where a high-k dielectric including oxides of hafnium and zirconium are used as etch stop layers and where the wet etching composition is advantageously used to remove the etch stop layer over a silicon oxide containing layer or structure, for example, an STI structure backfilled with STI oxide or an inter-metal dielectric (IMD) layer.

While the embodiments illustrated in the Figures and described above are presently preferred, it should be understood that these embodiments are offered by way of example only. The invention is not limited to a particular embodiment, but extends to various modifications, combinations, and permutations as will occur to the ordinarily skilled artisan that nevertheless fall within the scope of the appended claims.

What is claimed is:

1. A method for wet etching a material layer including oxides of hafnium and zirconium in a semiconductor micro-fabrication process comprising the steps of:

providing a material layer comprising an oxide of at least one of hafnium and zirconium overlying a silicon dioxide containing material layer; and, wet etching the material layer with a wet etching solution comprising at least a solvent and a halogen containing acid formed to have a first etching rate with respect to the material layer that is at least about a factor of 2.5 greater than a second etching rate with respect to the silicon dioxide containing material layer, wherein the wet etchant solution further comprises at least one surfactant selected front the group consisting of polyols comprising from about 0.1 weight percent to about 10 weight percent with respect to an arbitrary volume of the wet etchant solution.

2. The method of claim 1, wherein the solvent includes at least one of $H_2O$, $HClO_4$, an alcohol, tetrahydrofuran (THF), sulfuric acid ($H_2SO_4$) and dimethyl sulfoxide (DMSO).

3. The method of claim 1, wherein the solvent is present in the wet etchant solution at a weight percent greater than about 50 weight percent with respect to an arbitrary volume of the wet etchant solution.

4. The method of claim 1, wherein the halogen containing acid includes at least one of HF, HBr, HI, and $H_3ClO_4$.

5. The method of claim 1, wherein the halogen containing acid is present in the wet etchant solution from about 0.0001 weight percent to about 10 weight percent with respect to an arbitrary volume of the wet etchant solution.

6. A method for wet etching a material layer including oxides of hafnium and zirconium in a semiconductor microfabrication process comprising the steps of:

providing a material layer comprising an oxide of at least one of hafnium and zirconium overlying a silicon dioxide containing material layer; and, wet etching the material layer with a wet etching solution comprising at least a solvent and a halogen containing acid formed to have a first etching rate with respect to the material layer that is at least about a factor of 2.5 greater than a second etching rate with respect to the silicon dioxide containing material layer, wherein the wet etchant solution further comprises at least one chelating agent selected from the group consisting at diamines and beta-diketones comprising from about 0.1 weight percent to about 10 weight percent with respect to an arbitrary volume of the wet etchant solution.

7. The method of claim 6, wherein the step of providing a material layer comprises providing a gate dielectric layer comprising at least one of hafnium dioxide and zirconium dioxide.

8. The method of claim 6, wherein the step of providing a material layer comprises providing an etching stop layer comprising at least one of hafnium dioxide and zirconium dioxide.

9. The method of claim 6, wherein the step of wet etching comprises an etching rate of the material layer of greater than about 5 Angstroms per minute.

10. The method of claim 6, wherein the step of wet etching comprises the wet etchant solution maintained at a temperature of less than about 60° C.

11. The method of claim 6, wherein the step of wet etching comprises at least one of immersion and spraying.

* * * * *